(12) United States Patent
Van de Kerkhof (10) Patent No.: US 6,464,791 B1
(45) Date of Patent: Oct. 15, 2002

(54) LOW-PRESSURE APPARATUS FOR CARRYING OUT STEPS IN THE MANUFACTURE OF A DEVICE, A METHOD OF MANUFACTURING A DEVICE MAKING USE OF SUCH AN APPARATUS, AND A PRESSURE CONTROL VALVE

(75) Inventor: Antonius M. C. P. L. Van de Kerkhof, Nijmegen (NL)

(73) Assignee: Koninkijke Philips Electronics N.V., Eindhoven (NL)

( * ) Notice: Subject to any disclaimer, the term of this patent is extended or adjusted under 35 U.S.C. 154(b) by 157 days.

(21) Appl. No.: 09/606,338

(22) Filed: Jun. 29, 2000

(30) Foreign Application Priority Data

Jun. 30, 1999 (EP) .............................................. 99202115

(51) Int. Cl.$^7$ ............................................. C23C 16/00
(52) U.S. Cl. ....................................... 118/715; 251/205
(58) Field of Search .......................... 251/205; 118/715; 137/508

(56) References Cited

U.S. PATENT DOCUMENTS

| | | | | |
|---|---|---|---|---|
| 4,471,942 A | * | 9/1984 | Kocanowski | 251/205 |
| 4,681,613 A | * | 7/1987 | Porter | 65/1 |
| 5,108,074 A | | 4/1992 | Chavallaz | 251/205 |
| 5,368,276 A | * | 11/1994 | Pfeiffer | 251/205 |
| 5,685,912 A | * | 11/1997 | Nishizaka | 118/719 |
| 5,895,028 A | | 4/1999 | Varady | 251/205 |
| 5,921,528 A | * | 7/1999 | McCray | 251/208 |

FOREIGN PATENT DOCUMENTS

| | | |
|---|---|---|
| JP | 10252942 | 9/1998 |
| WO | 9612130 A1 | 4/1996 |

* cited by examiner

Primary Examiner—Gregory Mills
Assistant Examiner—Karla Moore
(74) Attorney, Agent, or Firm—Aaron Waxler (57) ABSTRACT

An apparatus for carrying out steps in the manufacture of a device under a prescribed pressure, the apparatus including a reactor chamber for accommodating the body, a gas supply pipe for introducing a process gas flow, an exhaust pump, an exhaust pipe, a pressure control valve for adjusting a valve opening, a pressure sensor and a control device. The pressure control valve comprising a first flow-through element and a second flow through element arranged behind each other in the exhaust pipe in the direction of the gas flow. Movement of either the first flow-through element or the second flow through element substantially transverse to the direction of gas flow establishes a desired overlap between the first flow-through element and second-flow through element and creates a common opening. The design of the pressure control valve renders the pressure control valve controllable in an almost fully-closed position, widening the range of prescribed pressures controllable with the valve.

7 Claims, 6 Drawing Sheets

LOW-PRESSURE APPARATUS FOR CARRYING OUT STEPS IN THE MANUFACTURE OF A DEVICE, A METHOD OF MANUFACTURING A DEVICE MAKING USE OF SUCH AN APPARATUS, AND A PRESSURE CONTROL VALVE

BACKGROUND OF THE INVENTION

The invention relates to a low-pressure apparatus for carrying out steps in the manufacture of a device, in particular, but not exclusively, a semiconductor device, which steps are performed under a prescribed pressure, the apparatus comprising:

a reactor chamber for accommodating a body, a gas supply pipe for introducing a process gas flow, which gas supply pipe is connected to the reactor chamber, an exhaust pump for evacuation, which exhaust pump is connected to the reactor chamber through an exhaust pipe, a pressure control valve for adjusting a valve opening, which pressure control valve is provided on the exhaust pipe, a pressure sensor for monitoring the pressure inside the reactor chamber, and control means for controlling the valve opening of the pressure control valve in dependence on the monitored pressure relative to the prescribed pressure as a target.

Such a low-pressure apparatus may be, for example, a chemical vapor deposition (CVD) apparatus, a sputtering apparatus or an evaporation apparatus, which are generally used for the deposition of a layer of a material on a surface of a body, for example a semiconductor body. The material may be a semiconductive material such as, for example, polycrystalline silicon or germanium, a conductive material such as, for example, tungsten, molybdenum or copper, or a dielectric material such as, for example, silicon oxide, silicon nitride or tantalum oxide. Alternatively, such a low-pressure apparatus may be used for the local or complete removal of a layer of, for example, one of the above-mentioned materials, from a surface of a body, for example a semiconductor body, by means of, for example, plasma etching or reactive ion etching.

In integrated circuit manufacturing technology, so-called multi-stepped processes are becoming increasingly important, as the performance of integrated circuits is more and more determined by the quality of the interfaces they are composed of. For example, blanket tungsten (W) chemical vapor deposition (CVD) used for filling vias and contact holes is advantageously carried out in two deposition steps. In a first deposition step using tungsten hexafluoride ($WF_6$) and silane ($SiH_4$) a thin layer of tungsten is grown on, for example, a titanium/titanium nitride (Ti/TiN) layer, which has been deposited in advance and serves as an adhesion/barrier layer. As the thin layer of tungsten needs to be grown in a controlled manner, the first deposition step is advantageously carried out under a relatively low prescribed pressure, for example a pressure of about 5 mbar. In a second deposition step using tungsten hexafluoride ($WF_6$), the vias or contact holes are finally filled with tungsten. In order to keep the process time needed for filling as short as possible, the second deposition step is advantageously carried out under a relatively high prescribed pressure, for example a pressure of about 400 mbar.

Large differences in prescribed pressures cannot be handled by a conventional pressure control valve such as, for example, a butterfly valve, which cannot be stably controlled in its almost fully-closed position and its almost fully-open position and has a limited region for stable control. A conventional pressure control valve suitable for stably controlling a prescribed pressure of, for example, 5 mbar at a given process gas flow and a given capacity of the exhaust pump, cannot be used for controlling a comparatively high prescribed pressure of, for example, above 100 mbar at a similar process gas flow and a similar pump capacity.

One way to cope with this problem is to enlarge the process gas flow supplied to the reactor chamber in such a way that the conventional pressure control valve can again be operated in its stable control region. However, a larger process gas flow decreases the residence time of the process gas inside the reactor chamber and, hence, lowers the efficiency of the process. As a consequence thereof, a needless waste of process gas takes place. Moreover, process costs become unnecessarily high. Another way to circumvent the above problem is to use separate reactor chambers for the different steps, each one of the separate reactor chambers having a pressure control valve and control means and being connected to either a separate exhaust pump or a common exhaust pump. However, since the number of periods required for purging, stabilizing, heating-up and cooling-down increases, the overall throughput decreases, which is not desired. In addition, exposure to a less clean environment in between the steps may, for example, adversely influence the quality of the interfaces of semiconductor devices. Moreover, the use of one reactor chamber connected to an exhaust pump through two separate exhaust pipes, each one of the separate exhaust pipes being provided with a pressure control valve, requires two control means for the one reactor chamber and, hence, a considerable modification of software in existing equipment.

SUMMARY OF THE INVENTION

The invention has inter alia for its object to provide a low-pressure apparatus of the kind mentioned in the opening paragraph, which apparatus enables steps to be carried out under very different prescribed pressures without the above-mentioned disadvantages.

For this purpose, in accordance with the invention, the pressure control valve comprises a flow channel, a first flow-through element and a second flow-through element, which first flow-through element and second flow-through element are arranged behind each other in the flow channel in the direction of the gas flow and border respectively a first flow-through opening and a second flow-through opening, at least one of the first flow-through element and the second flow-through element being movable substantially transversely to the direction of the gas flow in order to establish a desired overlap between the first flow-through opening and the second flow-through opening and create a common opening referred to as the valve opening, the first flow-through opening at least being provided with a first opening portion bordered by two first edges, which mutually taper into a pointed end, whereby the movable flow-through element at least is adjustable in a position in which the valve opening exclusively comprises only the pointed end of the first opening portion.

By virtue of the above-stated measures, the pressure control valve is controllable in its almost fully-closed position, which widens the range of prescribed pressures controllable with this valve towards higher pressures and enables the low-pressure apparatus to carry out steps under very different prescribed pressures without calling one of the earlier-mentioned disadvantages into being.

Advantageous embodiments of the low-pressure apparatus in accordance with the invention are described in the dependent claims.

The invention further relates to a method of manufacturing a device, in particular, but not exclusively, a semiconductor device, in which method a body is subjected to steps in the low-pressure apparatus mentioned in the opening paragraph, one of the steps being performed under a relatively high prescribed pressure and another under a relatively low prescribed pressure, whereby the relatively high prescribed pressure is controlled by adjusting the movable flow-through element in a position in which the valve opening exclusively comprises only the pointed end of the first opening portion of the first flow-through opening.

The invention also relates to a pressure control valve comprising a flow channel, a first flow-through element and a second flow-through element, which first flow-through element and second flow-through element are arranged behind each other in the flow channel in the direction of the gas flow and border respectively a first flow-through opening and a second flow-through opening, at least one of the first flow-through element and the second flow-through element being movable substantially transversely to the direction of the gas flow in order to establish a desired overlap between the first flow-through opening and the second flow-through opening and create a common opening referred to as valve opening hereinafter, the first flow-through opening at least being provided with a first opening portion bordered by two first edges, which mutually taper into a pointed end, whereby the movable flow-through element at least is adjustable in a position in which the valve opening exclusively comprises only the pointed end of the first opening portion. Hence, the pressure control valve is controllable in its almost fully-closed position, which widens the range of prescribed pressures controllable using this valve as compared to ranges controllable using conventional pressure control valves.

Advantageous embodiments of the pressure control valve in accordance with the invention are described in the dependent claims.

BRIEF DESCRIPTION OF THE DRAWING

These and other aspects of the invention will be apparent from and elucidated with reference to the embodiments described hereinafter and are shown in the drawing. In the drawing.

DESCRIPTION OF THE PREFERRED EMBODIMENTS

Figure 1:
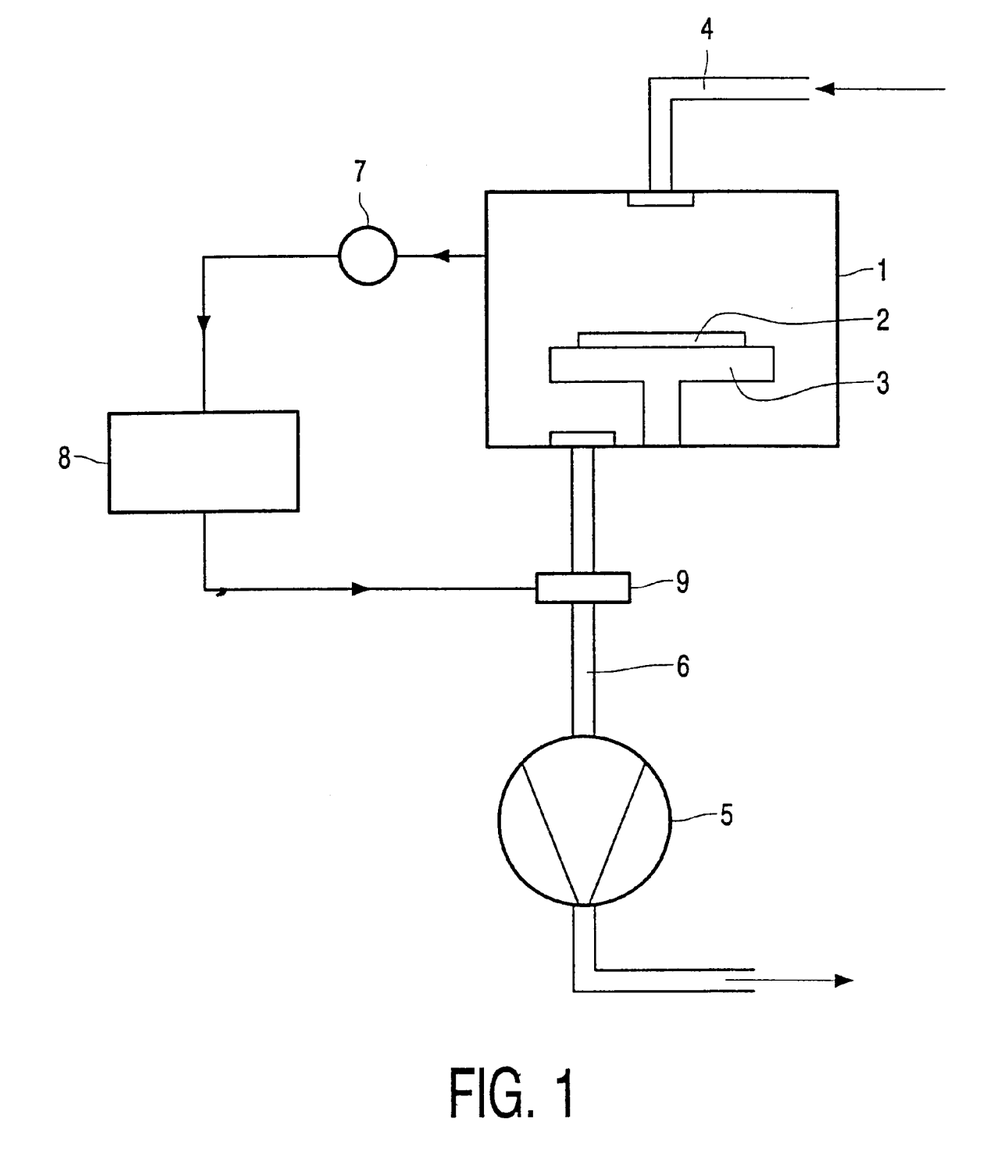
FIG. 1 shows in a diagrammatic view the low-pressure apparatus in accordance with the invention.

FIG. 1 shows a low-pressure apparatus for carrying out steps in the manufacture of a device, which steps are performed under a prescribed pressure, the apparatus comprising a reactor chamber 1 for accommodating a body 2, which may be placed on a holder 3, a gas supply pipe 4 for introducing a process gas flow, which gas supply pipe 4 is connected to the reactor chamber 1, and an exhaust pump 5 for evacuation, which exhaust pump 5 is connected to the reactor chamber 1 through an exhaust pipe 6. The exhaust pump 5 may be a single pump such as, for example, a rotary pump, but may alternatively be a pump system comprising two or more pumps arranged in series such as, for example, a Roots blower backed by a rotary pump. A heater (not shown) may be used to heat the body 2 to a desired temperature. The apparatus is further provided with a pressure sensor 7 for monitoring the pressure inside the reactor chamber 1, which pressure sensor 7 may be, for example, an absolute capacitance manometer working, for example, in the pressure range from about $1.10^{-3}$ mbar to 1 mbar or from about 1 mbar to 1000 mbar. If necessary, the pressure sensor 7 may comprise two absolute capacitance manometers having different pressure ranges, for example, the above-given ranges. An absolute capacitance manometer detects changes in the pressure as changes in the capacitance between a membrane and an electrode incorporated therein. The monitored pressure, or a signal, for example a magnified current, which is proportional thereto, is passed on to control means 8, which control means 8 compare the monitored pressure with the prescribed pressure as the target, and send a signal to a pressure control valve 9 having a valve opening, which signal incites the pressure control valve 9 to adjust the valve opening in such a way that the monitored pressure is brought to about the prescribed pressure as the target. Specifically, when a drop in the monitored pressure inside the reactor chamber is detected, a signal is sent by the control means 8 to the pressure control valve 9 to reduce the valve opening. Alternatively, when a rise in the monitored pressure inside the reactor chamber 1 is detected, a signal is sent by the control means 8 to the pressure control valve 9 to enlarge the valve opening. Hence, the control means 8 control the valve opening of the pressure control valve 9 in dependence on the monitored pressure relative to the prescribed pressure as a target. In the above way, the monitored pressure inside the reactor chamber 1 is adapted so as to be equal to the prescribed pressure as the target by balancing the process gas flow supplied to the reactor chamber 1 through the gas supply pipe 4 and the exhaust flow withdrawn from the reactor chamber 1 through the exhaust pipe 6, which exhaust flow depends on the valve opening of the pressure control valve 9 and the capacity of the exhaust pump 5. In order to reach a fast response during pressure control, the pressure control valve 9 is advantageously positioned close to the reactor chamber 1.

Figure 2:
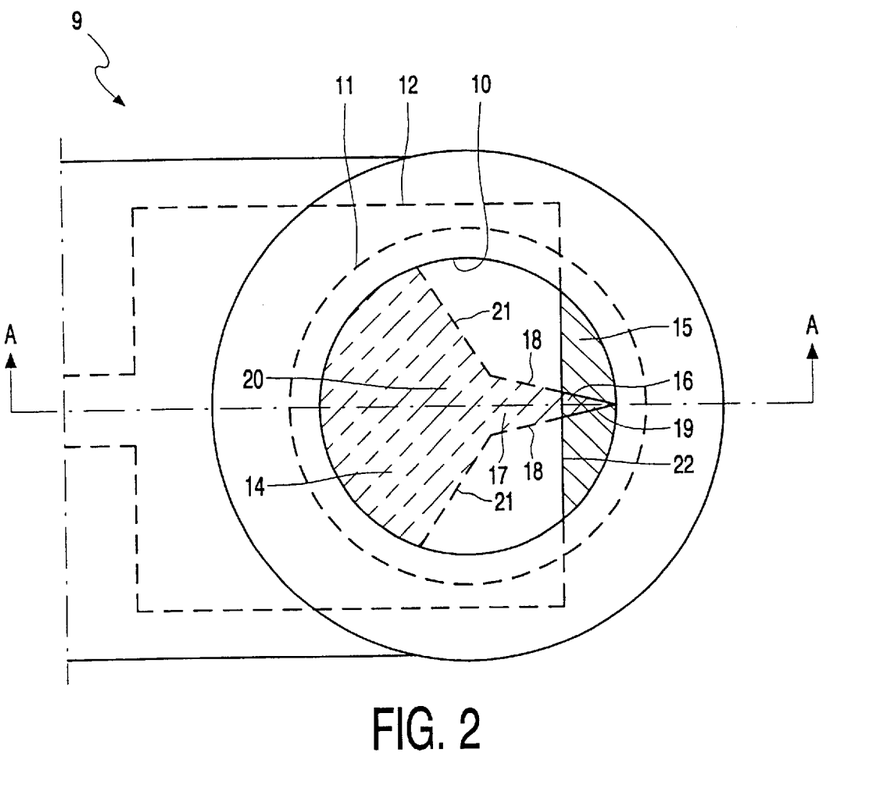
FIG. 2 shows in a diagrammatic top view a first embodiment of the pressure control valve in accordance with the invention, which top view is taken at the upstream side of the pressure control valve.
Figure 3:
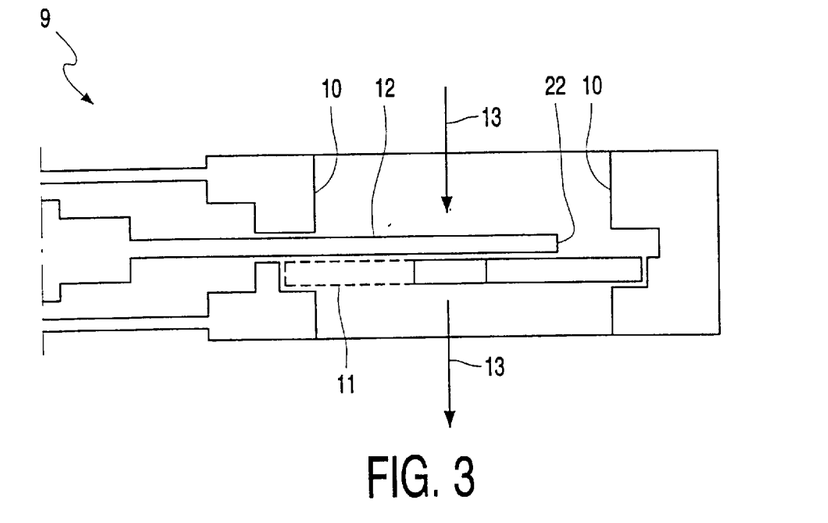
FIG. 3 shows in a diagrammatic cross-sectional view the pressure control valve of FIG. 2, which cross-sectional view is taken along line A—A in FIG. 2, FIGS. 4 to 7 show in diagrammatic cross-sectional views successive stages in the manufacture of a semiconductor device using the method in accordance with the invention.

FIG. 2 shows a diagrammatic top view of a first embodiment of the pressure control valve 9, which top view is taken at the upstream side of the pressure control valve. In addition, FIG. 3 shows a diagrammatic cross-sectional view of the pressure control valve 9 of FIG. 2, the cross-sectional view being taken along line A—A in FIG. 2.

The pressure control valve 9 comprises a flow channel 10, a first flow-through element 11 and a second flow-through element 12, which first flow-through element 11 and second flow-through element 12 are arranged behind each other in the flow channel 10 in the direction of the gas flow, which direction is depicted by arrows 13. In the present example, a disc is applied as the first flow-through element 11, which disc extends substantially transversely to the direction 13 of the gas flow and is mounted in the flow channel 10 in a fixed position. In addition, a slide is applied as the second flow-through element 12, which slide extends, and is movable, substantially transversely to the direction 13 of the gas flow. Here, the first flow-through element 11 is arranged behind the second flow-through element 12 in the direction 13 of the gas flow. However, it will be evident that in a slightly modified configuration the first flow-through element 11 can be arranged in front of the second flow-through element 12 in the direction 13 of the gas flow.

The first flow-through element 11 and the second flow-through element 12 border respectively a first flow-through opening 14 and a second flow-through opening 15. In the present example, the first flow-through opening 14 is a through-hole running from one surface of the first flow-through element 11 to an opposed other surface of the first flow-through element 11. The second flow-through element 12, in the present example a slide, is movable substantially transversely to the direction 13 of the gas flow in order to establish a desired overlap between the first flow-through opening 14 and the second flow-through opening 15 and to create a common opening 16, which common opening 16 is referred to as the valve opening of the pressure control valve 9. The movable second flow-through element 12 may be driven by, for example, a stepper motor. The first flow-through opening 14 is provided with a first opening portion 17 bordered by two first edges 18, which edges 18 both taper into a pointed end 19. The angle enclosed by the two first edges 18 is small. The movable second flow-through element 12 is adjustable to a position in which the valve opening 16 exclusively comprises only the pointed end 19 of the first opening portion 17. Hence, the pressure control valve 9 is controllable in its almost fully-closed position, which widens the range of prescribed pressures which can be controlled by means of this valve, compared with ranges controllable using conventional pressure control valves.

Besides the first opening portion 17, a second opening portion 20 is provided in the first flow-through opening 14, which second opening portion 20 links up with the first opening portion 17 and is bordered by two second edges 21, which taper with respect to each other and enclose a relatively large angle compared with the angle enclosed by the two first edges 18. The second flow-through opening 15 is bordered by an edge 22 of the second flow-through element 12, which edge 22 extends substantially transversely to a common bisector of the first opening portion 17 and the second opening portion 20.

The diameter of the flow channel 10 may be in the range from about 100 to 200 mm for prescribed pressures in the range from about $1.10^{-3}$ to 1 mbar, and in the range from about 20 to 40 mm for prescribed pressures in the range from about 1 to 1000 mbar.

The use of the low-pressure apparatus of FIG. 1 with the pressure control valve 9 shown in FIGS. 2 and 3 will now be illustrated for the earlier-mentioned blanket tungsten (W) CVD process, which is used in the manufacture of semiconductor devices such as, for example, field-effect transistors, floating gate transistors and CMOS and BIC-MOS integrated circuits to fill vias and contact holes. For this purpose, the reactor chamber 1 may accommodate one or more bodies 2, in the present example one or more wafers.

Figure 4:
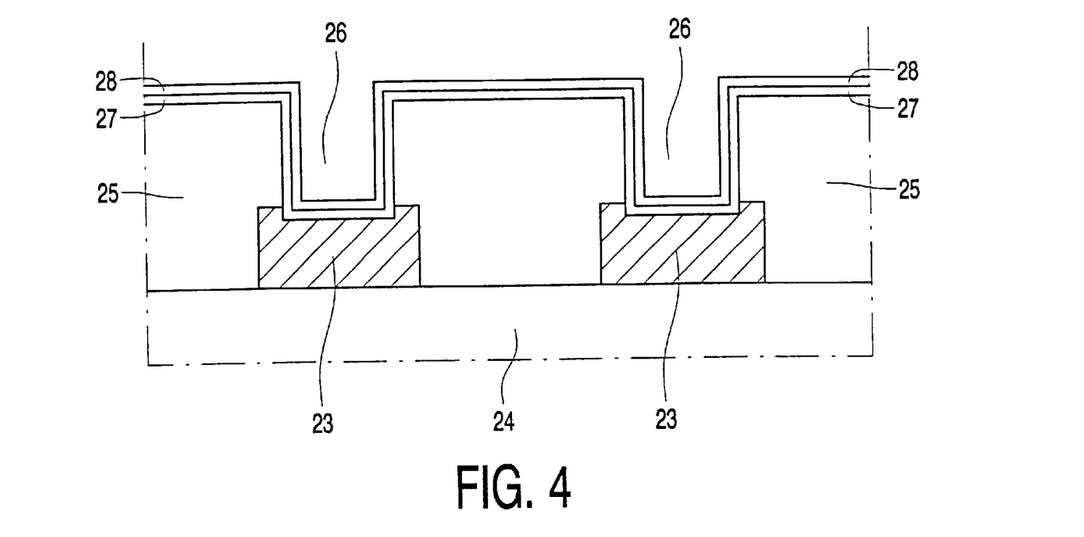
Figure 5:
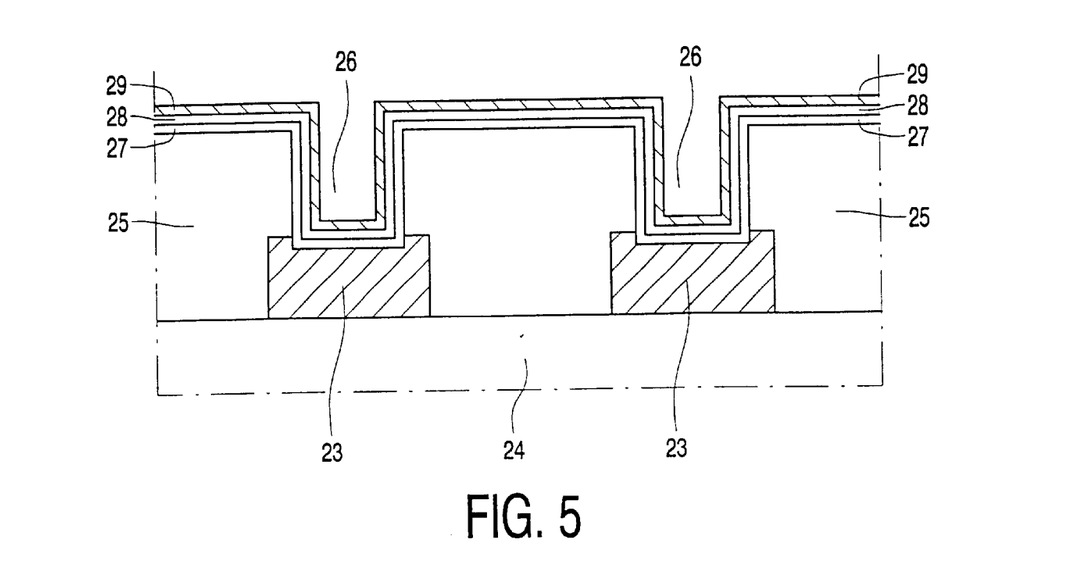
Figure 6:
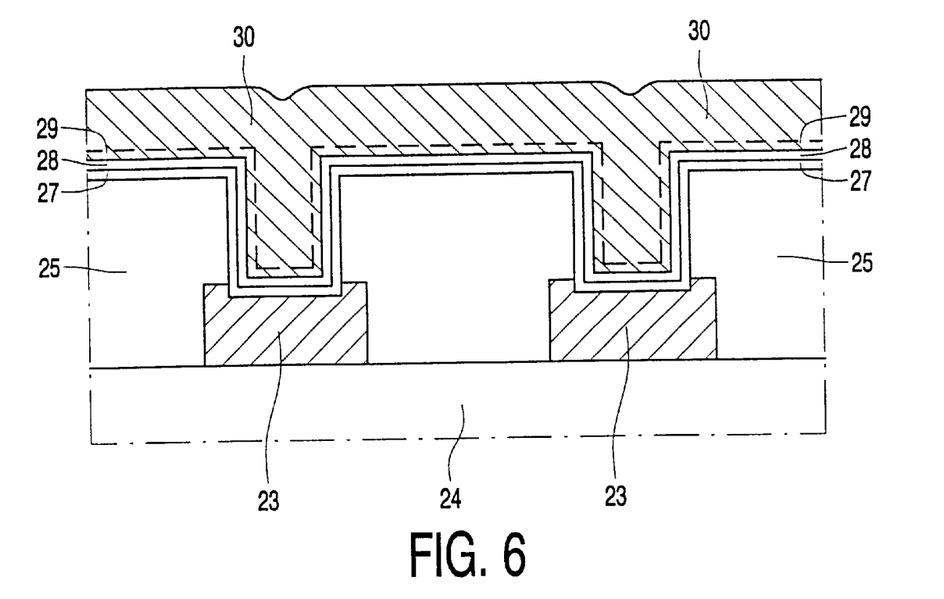
Figure 7:
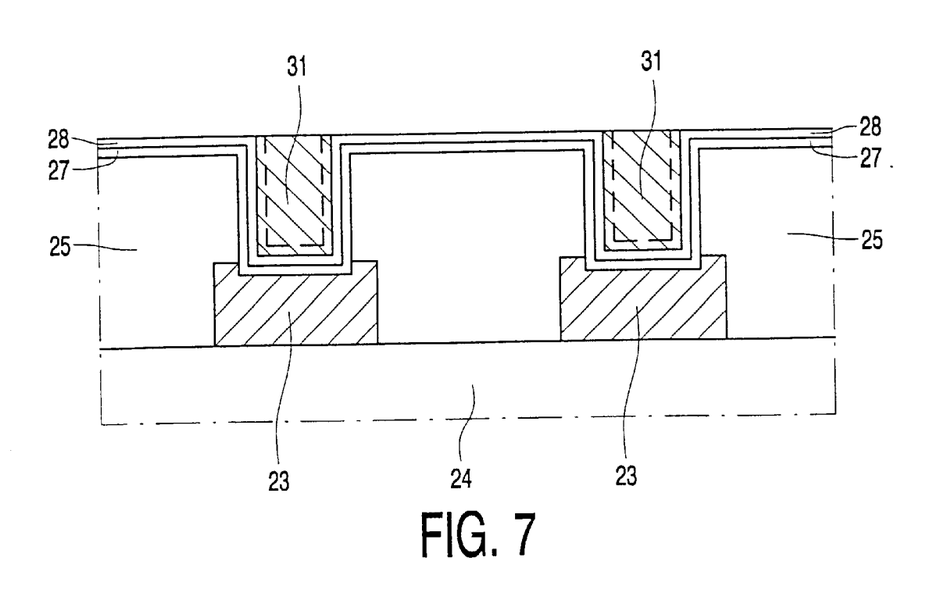

FIG. 4 shows conductor tracks 23 of, for example, aluminum, which conductor tracks 23 are disposed on a dielectric layer 24 composed of, for example, silicon oxide and are covered by a further dielectric layer 25 composed also of, for example, silicon oxide. In order to contact the conductor tracks 23, vias 26 have been etched in the further dielectric layer 25. Prior to filling the vias 26, a titanium (Ti) layer 27 and a titanium nitride (TiN) layer 28 are applied, which Ti/TiN double-layer 27,28 serves as an adhesion/barrier layer for tungsten, which is subsequently applied by means of the above-mentioned blanket tungsten CVD process. This process is advantageously carried out in two deposition steps, namely a first deposition step in which a thin layer 29 of tungsten is applied (FIG. 5), and a second deposition step in which a relatively thick layer 30 of tungsten is applied, thereby filling the vias 26 (FIG. 6). The relatively thick layer 30 of tungsten may subsequently be etched back until the TiN layer 28 is again exposed (FIG. 7), thereby forming tungsten plugs 31.

Figure 8:
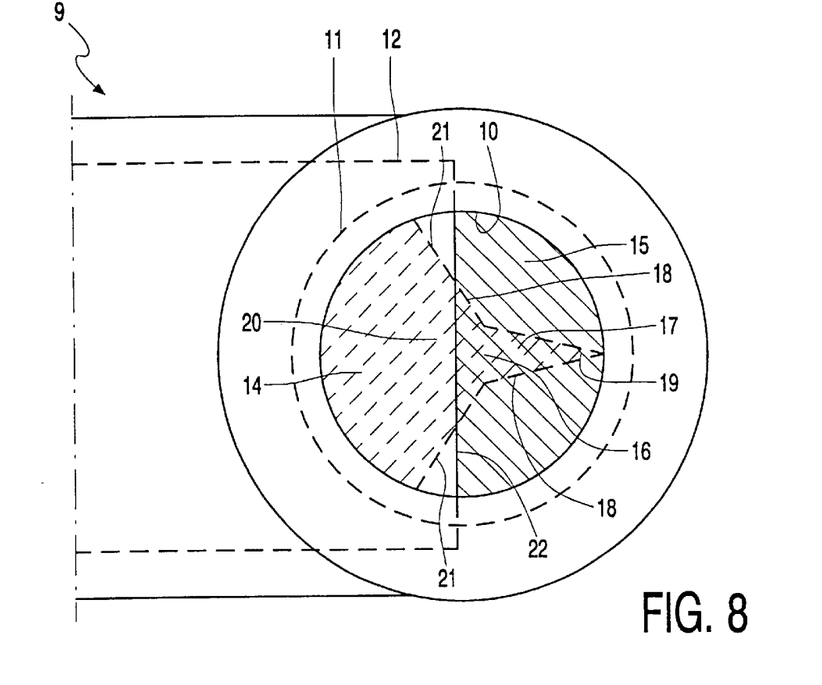
FIG. 8 shows in a diagrammatic top view the pressure control valve of FIG. 2, but now in another position.

As the thin layer 29 of tungsten needs to be applied in a controlled manner, the first deposition step is advantageously carried out under a relatively low prescribed pressure, for example a pressure of about 5 mbar. The temperature may amount to, for example, about 400° C. The process gas flow supplied to the reactor chamber 1 may comprise, for example, tungsten hexafluoride ($WF_6$), silane ($SiH_4$), hydrogen ($H_2$) and argon (Ar) at a total volume flow of, for example, about 2000 sccm (standard cubic centimeter per minute). The relatively low prescribed pressure of about 5 mbar is established by balancing the process gas flow supplied to the reactor chamber 1 and the exhaust flow withdrawn from the reactor chamber 1. For this purpose, the control means 8 send a signal to the pressure control valve 9, which signal incites the pressure control valve 9 to adjust the movable second flow-through element 12 to a position in which the valve opening 16 comprises the first opening portion 17 and a part of the second opening portion 20 of the first flow-through opening 14 of the first flow-through element 11. This is illustrated in the diagrammatic top view shown in FIG. 8, which top view is taken at the upstream side of the pressure control valve 9. It will be evident to a person skilled in the art that the pressure control valve 9 is stably controllable in this position.

In order to keep the process time needed for filling the vias 26 as short as possible, the second deposition step is advantageously carried out under a relatively high prescribed pressure, for example a pressure of about 400 mbar. The temperature may be, for example, about 450° C. The process gas flow supplied to the reactor chamber 1 may comprise, for example, tungsten hexafluoride ($WF_6$), hydrogen ($H_2$) and argon (Ar) at a total volume flow of, for example, about 2300 sccm (standard cubic centimeter per minute). The relatively high prescribed pressure of about 400 mbar is again established by balancing the process gas flow supplied to the reactor chamber 1 and the exhaust flow withdrawn from the reactor chamber 1. For this purpose, the control means 8 send a signal to the pressure control valve 9, which signal incites the pressure control valve 9 to adjust the movable second flow-through element 12 to a position in which the valve opening 16 exclusively comprises only the pointed end of the first opening portion 17 provided in the first flow-through opening 14 of the first flow-through element 11 (see FIG. 2). It will be evident to a person skilled in the art that, in contrast to conventional pressure control valves, the pressure control valve 9 is stably controllable in its almost fully-closed position, which widens the range of prescribed pressures which can be controlled by means of this valve, compared with the ranges controllable using conventional valves.

For evacuation of the reactor chamber 1, the control means 8 send a signal to the pressure control valve 9, which signal incites the pressure control valve 9 to adjust the movable second flow-through element 12 to a position in which the valve opening 16 at least substantially comprises the first flow-through opening 14 of the first flow-through element 11.

Figure 9:
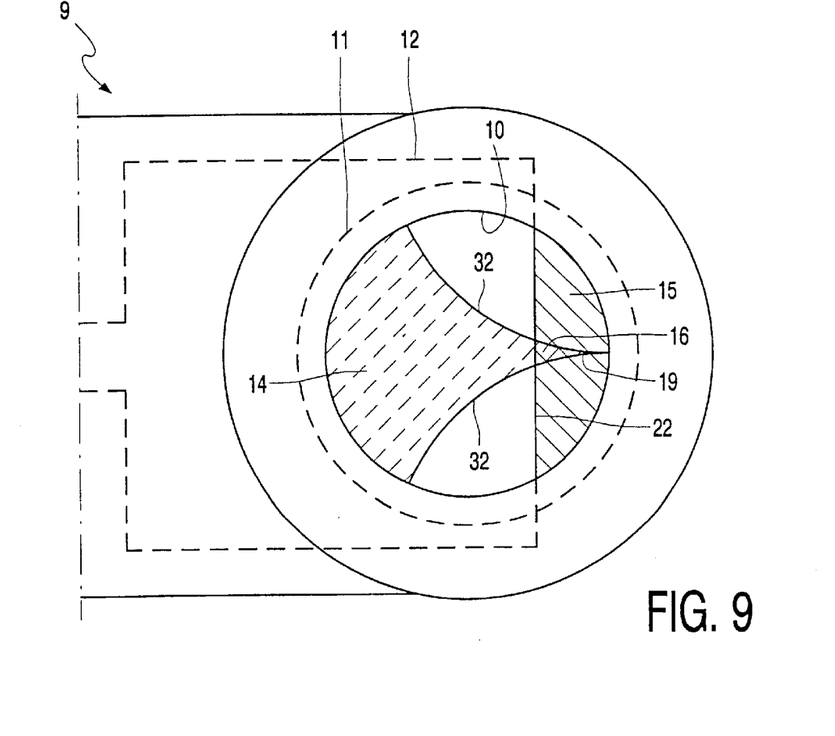
FIGS. 9 and 10 show in diagrammatic top views other embodiments of the pressure control valve in accordance with the invention, which top views are taken at the upstream side of the pressure control valve.

Obviously, the performance of the pressure control valve 9 is largely determined by the shape of the first flow-through opening 14 of the first flow-through element 11, which shape can be easily adapted to the requirements that the prescribed pressures should be controlled in steps of, for example, an etch process or deposition process. The first flow-through opening 14 depicted in FIGS. 2 and 3 is provided with two opening portions, namely the first opening portion 17 and the second opening portion 20, and is hence very suitable for the pressure regulation of a process, which applies two different prescribed pressures lying far apart. For a process applying, for example, three different prescribed pressures, the first flow-through opening 14 may be provided with three opening portions instead of two, and so on. However, in order to enlarge the flexibility of the first flow-through element 11, the first flow-through opening 14 of this element is advantageously constructed with monotonically diverging edges 32, as is shown in the diagrammatic top view of FIG. 9, which represents a second embodiment of the pressure control valve 9, the top view being taken at the upstream side of the pressure control valve.

Figure 10:
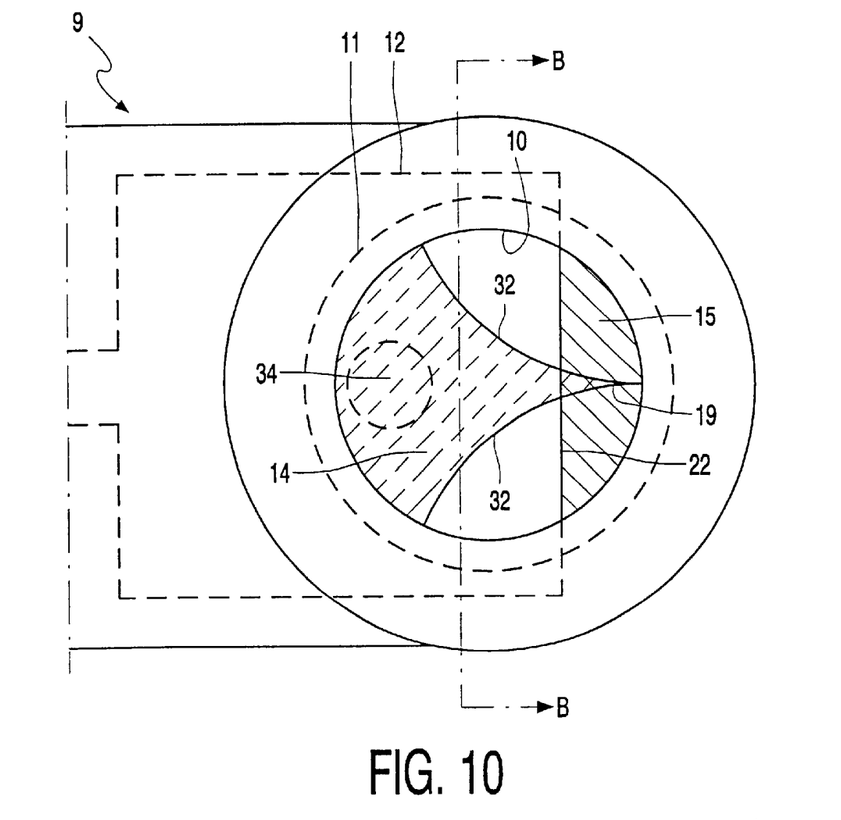
Figure 11:
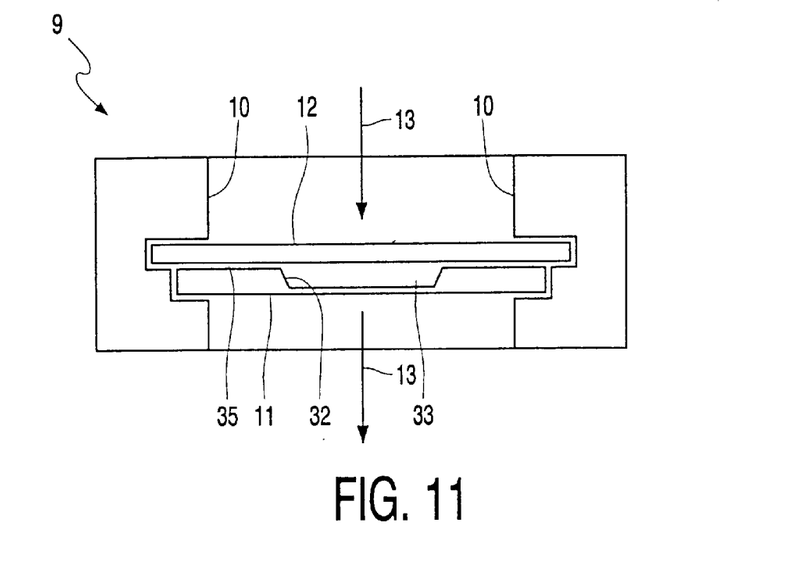
FIG. 11 shows in a diagrammatic cross-sectional view the pressure control valve of FIG. 10, which cross-sectional view is taken along line B—B in FIG. 10.

In the embodiments of the pressure control valve 9 described so far, the first flow-through opening 14, which is bordered by the first flow-through element 11, is a through-hole running from one surface of the first flow-through element 11 to an opposed other surface of the first flow-through element 1. The first flow-through opening 14 can, however, also be in the form of a groove 33 as depicted in FIGS. 10 and 11. FIG. 10 shows a diagrammatic top view of a third embodiment of the pressure control valve 9, which top view is taken at the upstream side of the pressure control valve. FIG. 11 shows a diagrammatic cross-sectional view of the pressure control valve 9 of FIG. 10, the cross-sectional view being taken along line B—B in FIG. 10. The first flow-through opening 14, which is in the form of the groove 33, comprises a through-hole 34 for transport of the gas flow in the direction of the exhaust pump 5. The width of the groove 33 may change with the depth of the groove 33. In the present example, the edges 32 bordering the groove 33 taper. In addition, the depth of the groove 33 may change between the through-hole 34 and the pointed end 19 of the groove 33. It may be advantageous that the depth of the groove 33 decreases going from the through-hole opening 34 to the pointed end 19.

In the above described embodiments of the pressure control valve 9, the first flow-through element 11 and the second flow-through element 12 may be arranged so as to be in direct contact with each other. However, particle release upon movement of the second flow-through element 12 may adversely affect the performance of, for example, semiconductor devices being processed. Alternatively, the first flow-through element 11 and the second flow-through element 12 may be arranged in such a way that a gap 35 exists between them (see FIG. 11). The thickness of the gap 35 has to be small, for example somewhere around 5 $\mu$m. However, sagging of at least one of the first flow-through element 11 and the second flow-through element 12 may adversely affect the thickness of the gap 35. Another option is the use of a, for example, 5 $\mu$m thick gap 35 combined with so-called air bearings, which may be based on nitrogen gas.

This technique circumvents the above-mentioned problems and at the same time keeps the gap 35 clean.

It is obvious that numerous possibilities can be thought of as regards the shape of the first flow-through opening 14. In order to easily change over from one shape to another, the first flow-through element 11 may advantageously comprise a first body wherein the first flow-through opening 14 is made, which first body may, for example, be fixed within a ring. In addition, in order to easily change the profile of the edge 22 of the second flow through element 12, it may be advantageous for the second flow-through element 12 to comprise a second body providing the edge 22.

It will be apparent that the invention is not limited to the embodiments described above, since many variations are possible to those skilled in the art without departing from the scope of the invention. Besides the above-described slide/disc configurations of the pressure control valve, other configurations working according to the same principle can be thought of, which other configurations may rely on two movable flow-through elements instead of one movable flow-through element.

Although the low-pressure apparatus in accordance with the invention is in general usable for low-pressure processes comprising steps to be performed under prescribed pressures, it can be advantageously used for low-pressure processes comprising steps to be performed under very different prescribed pressures. The reactor chamber may be part of a cluster tool comprising a series of reactor chambers, but may alternatively be a stand-alone reactor unit such as, for example, a conventional low-pressure CVD (LPCVD) reactor. Such an LPCVD reactor is a multi-wafer reactor enabling the simultaneous processing of a large number of wafers. Besides multi-wafer reactors, single-wafer reactors used for the processing of a single wafer at a time, and medium-sized reactors exist.

What is claimed is:

1. A low-pressure apparatus for carrying out steps in the manufacture of a device, which steps are performed under a prescribed pressure, the apparatus comprising:

a reactor chamber for accommodating a body, a gas supply pipe for introducing a process gas flow, which gas supply pipe is connected to the reactor chamber, an exhaust pump for evacuation, which exhaust pump is connected to the reactor chamber through an exhaust pipe, a pressure control valve for adjusting a valve opening, which pressure control valve is provided on the exhaust pipe, the pressure control valve comprising a flow channel, a first flow-through element and a second flow-through element, which first flow-through element and second flow-through element are arranged behind each other in the flow channel in the direction of the gas flow and border respectively a first flow-through opening and a second flow-through opening, at least one of the first flow-through element and the second flow-through element being movable substantially transversely to the direction of the gas flow in order to establish a desired overlap between the first flow-through opening and the second flow-through opening and create a common opening referred to as the valve opening, the first flow-through opening at least being provided with a first opening portion bordered by two first edges, which mutually taper into a pointed end, whereby the movable flow-through element at least is adjustable in a position in which the valve opening exclusively comprises only the pointed end of the first opening portion, and wherein the valve opening extends to an outer edge of the first flow-through element, a pressure sensor for monitoring the pressure inside the reactor chamber, and control means for controlling the .valve opening of the pressure control valve in dependence on the monitored pressure relative to the prescribed pressure as a target.

2. A low-pressure apparatus as claimed in claim 1, wherein the first flow-through element comprises a first body wherein the first flow-through opening is made, which first body extends substantially transversely to the direction of the gas flow and is mounted in the flow channel in a fixed position, while the second flow-through element comprises a second body bordering the second flow-through opening and extending substantially transversely to the direction of the gas flow, which second body is movable substantially transversely to the direction of the gas flow.

3. A low-pressure apparatus as claimed in claim 1, wherein the two first edges, which taper with respect to each other and border the first opening portion of the first flow-through opening, enclose a relatively small angle, and a second opening portion is provided in the first flow-through opening, which second opening portion links up with the first opening portion and is bordered by two second edges, which taper with respect to each other and enclose a relatively large angle, while the second flow-through opening is bordered by an edge which extends substantially transversely to a common bisector of the first opening portion and the second opening portion.

4. A method of manufacturing a device, in which method a body is subjected to steps in a low-pressure apparatus as claimed in any one of claims 1 through 3, one of the steps being performed under a relatively high prescribed pressure and another under a relatively low prescribed pressure, whereby the relatively high prescribed pressure is controlled by adjusting the movable flow-through element to a position in which the valve opening exclusively comprises only the pointed end of the first opening portion of the first flow-through opening.

5. A pressure control valve comprising a flow channel, a first flow-through element and a second flow-through element, which first flow-through element and second flow-through element are arranged behind each other in the flow channel in the direction of the gas flow and border respectively a first flow-through opening and a second flow-through opening, at least one of the first flow-through element and the second flow-through element being movable substantially transversely to the direction of the gas flow in order to establish a desired overlap between the first flow-through opening and the second flow-through opening and create a common opening referred to as valve opening hereinafter, the first flow-through opening at least being provided with a first opening portion bordered by two first edges, which both taper into a pointed end, whereby the movable flow-through element at least is adjustable to a position in which the valve opening exclusively comprises only the pointed end of the first opening portion, and wherein the valve opening extends to an outer edge of the first flow-through element.

6. A pressure control valve as claimed in claim 5, wherein the first flow-through element comprises a first body wherein the first flow-through opening is made, which first body extends substantially transversely to the direction of the gas flow and is mounted in the flow channel in a fixed position, while the second flow-through element comprises a second body bordering the second flow-through opening and extending substantially transversely to the direction of the gas flow, which second body is movable substantially transversely to the direction of the gas flow.

7. A pressure control valve as claimed in claim 5, wherein the two first edges, which taper with respect to each other and border the first opening portion of the first flow-through opening, enclose a relatively small angle, and a second opening portion is provided in the first flow-through opening, which second opening portion links up with the first opening portion and is bordered by two second edges, which taper with respect to each other and enclose a relatively large angle, while the second flow-through opening is bordered by an edge which extends substantially transversely to a common bisector of the first opening portion and the second opening portion.

* * * * *